US011855652B2

(12) United States Patent
Hung et al.

(10) Patent No.: US 11,855,652 B2
(45) Date of Patent: Dec. 26, 2023

(54) CALIBRATING A MULTIPLEXER OF AN INTEGRATED CIRCUIT

(71) Applicant: XILINX, INC., San Jose, CA (US)

(72) Inventors: Hao-Wei Hung, New Taipei (TW); Tan Kee Hian, Singapore (SG); Siok Wei Lim, Singapore (SG); Hongtao Zhang, San Jose, CA (US)

(73) Assignee: XILINX, INC., San Jose, CA (US)

( * ) Notice: Subject to any disclaimer, the term of this patent is extended or adjusted under 35 U.S.C. 154(b) by 105 days.

(21) Appl. No.: 17/643,349

(22) Filed: Dec. 8, 2021

(65) Prior Publication Data

US 2023/0179216 A1 Jun. 8, 2023

(51) Int. Cl.
*H03M 1/10* (2006.01)
*H03M 9/00* (2006.01)
*H03M 1/66* (2006.01)

(52) U.S. Cl.
CPC ....... *H03M 1/1023* (2013.01); *H03M 1/1047* (2013.01); *H03M 9/00* (2013.01); *H03M 1/66* (2013.01)

(58) Field of Classification Search
CPC .... H03M 1/1023; H03M 1/1047; H03M 1/66; H03M 9/00
USPC ........................................................ 341/120
See application file for complete search history.

(56) References Cited

U.S. PATENT DOCUMENTS

| 10,560,097 | B1 * | 2/2020 | Peng | H03K 19/1737 |
| 11,003,203 | B2 * | 5/2021 | Poon | G06F 1/04 |
| 2020/0293080 | A1 * | 9/2020 | Poon | H03K 5/1565 |

OTHER PUBLICATIONS

Y. Frans et al., "A 40-to-64 Gb/s NRZ Transmitter With Supply-Regulated Front-End in 16 nm FinFET," in IEEE Journal of Solid-State Circuits, vol. 51, No. 12, pp. 3167-3177, Dec. 2016.

* cited by examiner

*Primary Examiner* — Khai M Nguyen
(74) *Attorney, Agent, or Firm* — Patterson + Sheridan, LLP

(57) ABSTRACT

A multiplexer (MUX) calibration system includes main MUX circuitry, first replica MUX circuitry, digital-to-analog (DAC) circuitry, detection circuitry, and control circuitry. The main MUX circuitry receives clock signals and outputs a first data signal based on the clock signals. The first replica MUX circuitry receives the clock signals and outputs a second data signal based on the clock signals. The DAC circuitry generates an offset voltage. The detection circuitry receives the second data signal and the offset voltage and generates a first error signal based on one or more of the second data signal and the offset voltage. The control circuitry receives the first error signal and generates a first control signal indicating an adjustment to the clock signals.

20 Claims, 8 Drawing Sheets

CALIBRATING A MULTIPLEXER OF AN INTEGRATED CIRCUIT

TECHNICAL FIELD

Examples of the present disclosure generally relate to integrated circuits, and, more particularly, to calibrating multiplexer circuitry of an integrated circuit.

BACKGROUND

Transmitter circuitry of a communication system includes a multiplexer (MUX) that generates an output signal (e.g., a data signal) based on clock signals. However, duty cycle error and phase mismatch within the clock signals cause errors within the transmitter circuitry. Calibration circuitry is used to detect and mitigate the duty cycle error and phase mismatch within the clock signals. The calibration circuitry adjusts clock generation circuitry to mitigate duty cycle error and phase mismatch within the clock signals.

In some instances, the transmitter circuitry includes a MUX having a 4 to 1 ratio. The MUX generates data signals based on the clock signals. Errors within the clock signals are detected by monitoring the data signals. However, monitoring the data signals increases the output loading of the transmitter circuitry, decreasing the bandwidth of the transmitter circuitry. In other instances, a replica MUX may be used to detect error within the clock signals. The replica MUX is configured similar to the main 4 to 1 MUX. The replica MUX receives the clock signals and generates a data signal that is used to correct the clock signals. However, differences (e.g., circuitry mismatch) between the main MUX and the replica MUX, reduces performance of the transmitter circuitry.

SUMMARY

A communication device includes transmitter circuitry for communicating data signals. The transmitter circuitry uses clock signals to generate and communicate the data signals. A multiplexer (MUX) may be used to generate the data signals. The MUX generates the data signals from the clock signals. The transmitter circuitry includes a replica MUX that is used to calibrate the clock signals. Further, a digital-to-analog converter (DAC) circuitry is used to compensate for mismatch (e.g., circuitry element mismatch) between the replica MUX and the main 4 to 1 MUX.

In one example, a multiplexer (MUX) calibration system includes main MUX circuitry, first replica MUX circuitry, digital-to-analog (DAC) circuitry, detection circuitry, and control circuitry. The main MUX circuitry receives clock signals and outputs a first data signal based on the clock signals. The first replica MUX circuitry receives the clock signals and outputs a second data signal based on the clock signals. The DAC circuitry generates an offset voltage. The detection circuitry receives the second data signal and the offset voltage and generates a first error signal based on one or more of the second data signal and the offset voltage. The control circuitry receives the first error signal and generates a first control signal indicating an adjustment to the clock signals.

In one example, transmitter circuitry comprises a MUX calibration system and clock generation circuitry. The MUX calibration system includes main MUX circuitry, first replica circuitry, and DAC circuitry. The main MUX circuitry receives clock signals and outputs a first data signal based on clock signal. The first replica MUX circuitry receives the clock signals and outputs a second data signal based on the clock signals. The DAC circuitry generates an offset voltage. The MUX calibration system generates a control signal based on a first error signal determined based on the second data signal and the offset voltage. The clock generation circuitry is coupled to the main MUX circuitry and the first replica MUX circuitry. The clock generation circuitry adjusts the clock signals based on the control signal.

In one example, a method for calibrating a MUX includes generating, via a first replica MUX circuitry of a MUX calibration system, a first data signal based on clock signals. The method further includes outputting, via a DAC of the MUX calibration system, a first offset voltage. Further, the method includes generating a first error signal based on the first data signal and the first offset voltage, generating a first control signal based on the first error signal, and adjusting the clock signals based on the first control signal.

BRIEF DESCRIPTION OF THE DRAWINGS

So that the manner in which the above-recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
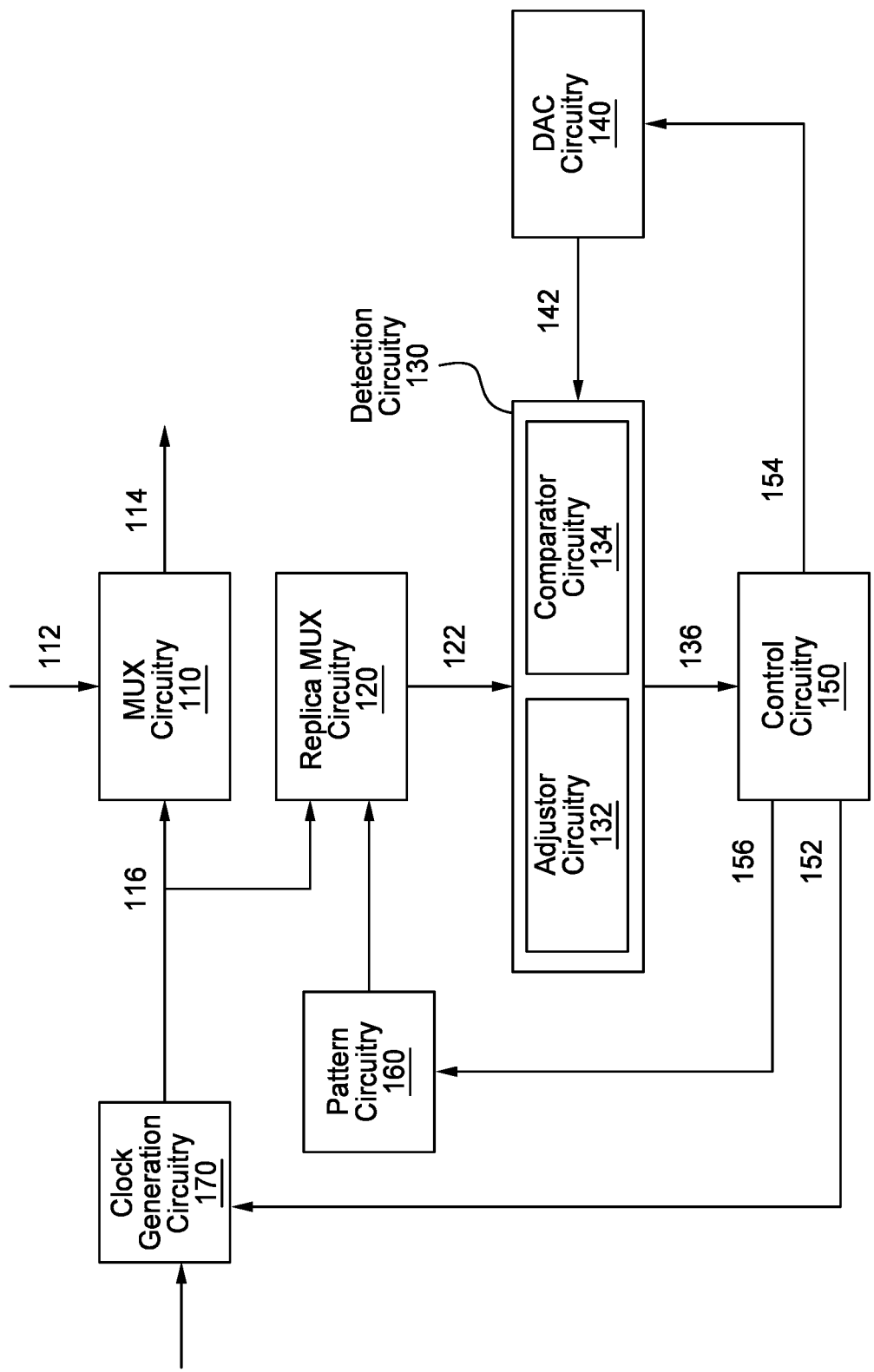
FIG. 1 is a schematic diagram of multiplexer calibration system, according to an example.

Communication devices use transmitter circuitries to transmit (communicate) data signals. Conventional transmitter circuitry may also be referred to as a transmitter front end. The transmitter circuitry generates and communicates data signals based on clock signals. Errors within clock signals may be propagated as errors within data signals. The clock signal errors are duty cycle errors within the clock signals and/or phase errors within the clock signals. In one or more examples, the transmitter circuitry uses sets of clock signals that are in quadrature with each other. In such examples, without employing error compensation techniques, duty cycle errors and/or phase mismatch between the sets of clock signals may negatively affect the data signals. For example, duty cycle errors and/or phase mismatch may result in the data signal having an incorrect value.

Conventional transmitter circuitry includes calibration circuitry that reduces the clock signal errors, however, in some examples, the calibration circuitry increases the loading of the transmitter circuitry, reducing the bandwidth of the transmitter circuitry. Further, the calibration circuitry may increase the power consumption of the transmitter circuitry.

In one or more example, conventional transmitter circuitry includes a main, or operating, multiplexer (MUX) that generates the data signal based on clock signals. The transmitter circuitry further includes a replica MUX used in calibration of the clock signals. The replica MUX has similar circuitry and timing parameters as the main MUX. The replica MUX receives the same clock signals as the main MUX. Accordingly, the data output of the replica MUX may be used to calibrate the clock signals. For example, the data output of the replica MUX is processed to calibrate the clock signals. The replica MUX and the main MUX may differ from each other due to mismatch (e.g., circuitry mismatch).

In the following, MUX calibration systems are describe that use replica MUXs and DAC circuits to calibration clock signals. Using a replica MUX with a DAC circuitry mitigates mismatch between the replica MUX and the main MUX, improving performance of the corresponding transmitter circuitry. For example, to compensate for the mismatch, the transmitter circuitry includes a digital-to-analog converter (DAC) circuitry to adjust a voltage offset. Adjusting for the offset further improves the calibration of the clock signals.

Further, using differently sized replica MUX and a DAC circuitry to calibrate clock signals, mitigates errors within the clock signals while using less power than calibration techniques that either use a single MUX and/or do not include a DAC circuit. For example, the transmitter circuitry includes a first and a second replica MUX. The first and second replica MUXs may have different circuit sizes from each other. For example, the circuit size of the second replica MUX may be larger than that of the first replica MUX. Accordingly, mismatch within the second replica MUX is less than that of the first replica MUX. The second replica MUX is used to make first calibration adjustments to the clock signals and the first replica MUX is used to make second calibration adjustments to the clock signals. As the second replica MUX has smaller mismatch than the first replica MUX, the second replica MUX more accurately calibrates the clock signals. However, as the second replica MUX has a larger circuit size than that of the first replica MUX, the second replica MUX uses more power than the first replica MUX. To reduce the power usage of the corresponding transmitter circuitry, the first replica MUX is used to make the second (e.g., fine) adjustments to the clock signals. The second adjustments may minimize errors that are generated due to changes in the operating parameters (e.g., voltage or temperature) of the transmitter circuitry. Once the initial calibration is completed by second replica MUX, the second replica MUX is disabled to reduce the power consumption of the transmitter circuitry. A DAC circuitry may be used to minimize mismatch between the first and second replica MUXs, further improving the calibration of the clock signals. In one or more examples, mismatch between the first and second replica MUXs may be determined (and saved) and adjusted by the DAC circuitry. In such an example, the first replica MUXs, which is smaller than the second replica MUX, may be used for background calibration instead of relying on the larger second replica MUX.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

FIG. 1 is a schematic block diagram of a MUX calibration system 100, according to one or more examples. The MUX calibration system 100 includes MUX circuitry 110, replica MUX circuitry 120, detection circuitry 130, digital-to-analog converter (DAC) circuitry 140, and control circuitry 150. In one example, the DAC circuitry 140 is configured to compensate for mismatch between the replica MUX circuitry 120 and the MUX circuitry 110. In other examples, as will be described with regard to FIG. 2, the DAC circuitry 140 is configured to compensate for mismatch between replica MUX circuitries (e.g., the replica MUX circuitries 220 and 230 of FIG. 2. The MUX calibration system 100 further includes pattern circuitry 160. The MUX calibration system 100 may further include clock generation circuitry 170. The clock generation circuitry 170 is configured to perform duty cycle and delay correction. In one example, the clock generation circuitry 170 is external to the MUX calibration system 100. As is described in greater detail with regard to FIG. 4, the MUX calibration system 100 may be part of transmitter circuitry of a communication system.

Figure 3:
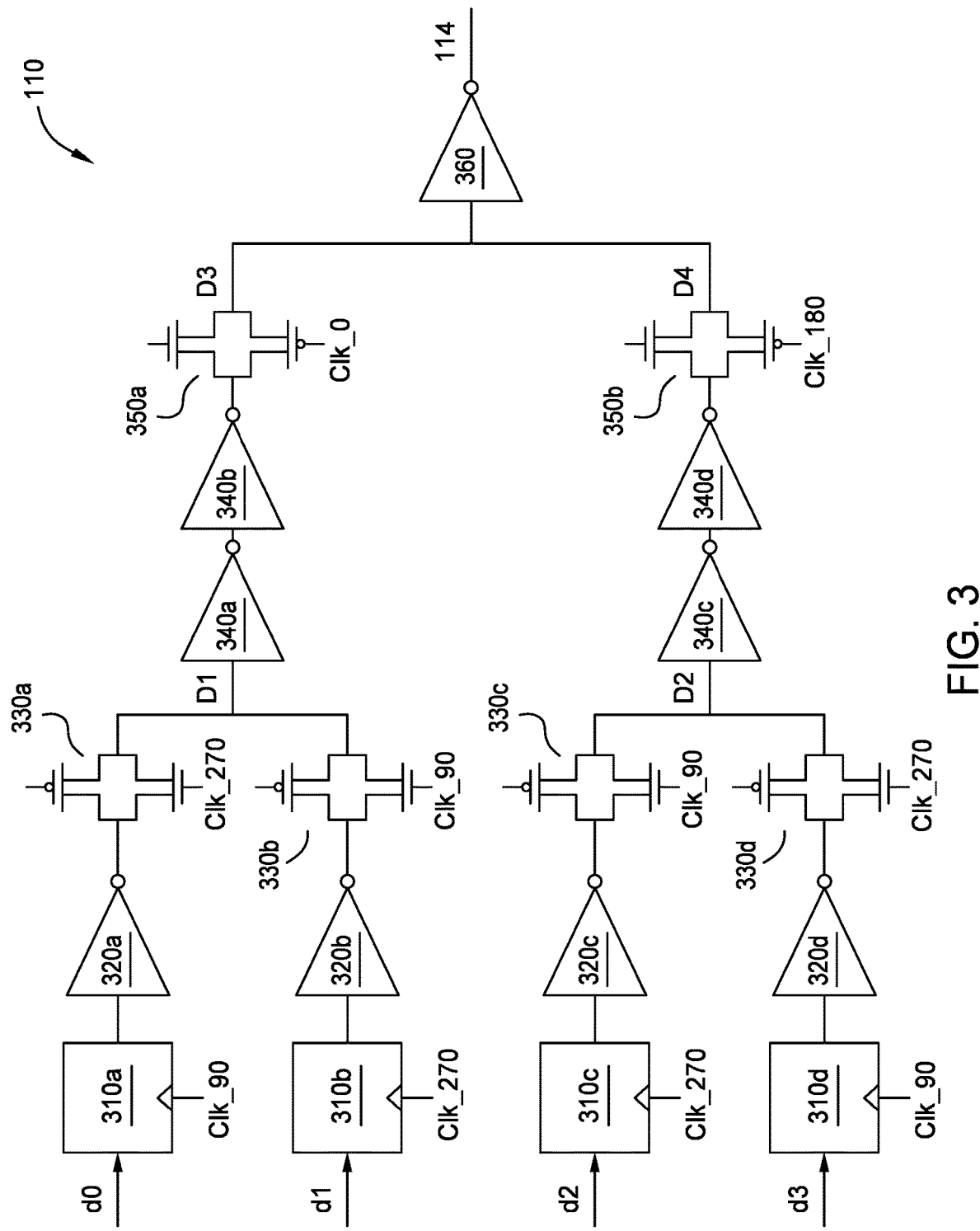
FIG. 3 is a schematic diagram of a multiplexer, according to an example.

The MUX circuitry 110 receives the clock signals 116 from the clock generation circuitry 170, the data signal 112, and outputs the data signal 114. In one example, the MUX circuitry 110 serializes the data signal 112 with the clock signal 116. Further, the MUX circuitry 110 may be a 4 to 1 MUX. FIG. 3 is a block diagram of an example 4 to 1 MUX.

As illustrated in FIG. 3, the MUX circuitry 110 includes latch circuitries 310, buffers 320, 340 and 360, and switches 330 and 350. Each latch circuitry 310 receives a respective data signal (e.g., data signal d0-d3) of the data signals 112. Further, each latch circuitry 310 receives a clock signal (e.g., clock signals Clk_90 and Clk_270) of the clock signals 116. For example, the latch circuitry 310a receives the data signal d0 and the clock signal Clk_90, the latch circuitry 310b receives the data signal d1 and the clock signal Clk_270, the latch circuitry 310c receives the data signal d2 and the clock signal Clk_270, and the latch circuitry 310c receives the data signal d2 and the clock signal Clk_90. The latch circuitries 310a-310d receive the data signals d0-d3 in parallel to each other.

The output of the latch circuitry 310a is coupled to the buffer 320a. The output of the buffer 320a is coupled to the switch 330a that is controlled by the clock signal Clk_270. The output of the latch circuitry 310b is coupled to the buffer 320b. The output of the buffer 320b is coupled to the switch 330b that is controlled by the clock signal Clk_90. The output of the latch circuitry 310c is coupled to the buffer 320c. The output of the buffer 320c is coupled to the switch 330c that is controlled by the clock signal Clk_90. The output of the latch circuitry 310d is coupled to the buffer 320d. The output of the buffer 320d is coupled to the switch 330c that is controlled by the clock signal Clk_270. One or more of the buffers 320a-320d is an inverter buffer. In one or more examples, instead of a single buffer 320 being coupled to the output of a corresponding latch circuitry 310, two or more buffers 320 may be serially coupled to the output of a corresponding latch circuitry 310.

The outputs of the switches 330a and 330b are coupled to the input of the buffer 340a. The output of the buffer 340a is coupled to the input of the buffer 340b. The buffers 340a and 340b may be inverting buffers. The output of the buffer 340b is coupled to the input of the switch 350a. The outputs of the switches 330c and 330d are coupled to input of the buffer 340c. The output of the buffer 340c is coupled to the input of the buffer 340d. The buffers 340c and 340d may be inverting buffers. The output of the buffer 340d is coupled to the input of the switch 350b. The output of the switches 350a and 350b is coupled to the input of the buffer 360. The buffer 360 may be an inverting buffer. In one or more examples, more than two buffers 340 may be serially connected to the inputs of the switches 350.

The latch circuitry 310a outputs the data signal d0 to the buffer 320a and the latch circuitry 310d outputs the data signal d3 to the buffer 320d based on the clock signal Clk_90. The latch circuitry 310b outputs the data signal d1 to the buffer 320b and the latch circuitry 310c outputs the data signal d1 to the buffer 320c based on the clock signal Clk_270. The switches 330a and 330b control the data signal D1 based on the clock signals Clk_270 and Clk_90, respectively. The switch 330a outputs the buffered data signal d0 as data signal D1 based on the clock signal Clk_270. The switch 330b outputs the buffered data signal d1 as data signal D1 based on the clock signal Clk_90. The data signal D1 is buffered by the buffers 340a and 340b and output to the switch 350a.

The switches 330c and 330d control the data signal D2 based on the clock signals Clk_90 and Clk_270, respectively. The switch 330c outputs the buffered data signal d2 as data signal D2 based on the clock signal Clk_90. The switch 330d outputs the buffered data signal d3 as data signal D2 based on the clock signal Clk_270. The data signal D2 is buffered by the buffers 340c and 340d and output to the switch 350b.

The switch 350a outputs the buffered data signal D1 as the data signal D3 based on the clock signal Clk_0. The switch 350b outputs the buffered data signal D2 as the data signal D4 based on the clock signal Clk_180. The buffer 360 receives the data signals D3 and D4, buffers the received data signal to output the data signal 114. The data signal 114 is the buffered data signal D3 or D4.

In one or more examples, the replica MUX circuitries 120, 220, and 230 are used to mitigate delay within the MUX circuitry 110. For example, the replica MUX circuitries 120, 220, and 230 are used to calibrate the timing of the switches 330a-330d, and 350a-350b to ensure that the delay time for both signals triggered by clk_0 and clk_90, e.g., signals D1 and D2 reach the data signal 114 at a fixed interval. The fixed interval is based on a data rate of a corresponding system. In one example, the data rate is about 17.86 ps at 56 Gbps. In other examples, other data rates may be used. In an example where the clock signals Clk_0 and Clk_270 are X ps apart, Clk_0 is further delayed to compensate for the delay of buffers 340a and 340b.

In one example, as the four clock signals Clk_0, CLk_90, Clk_180, and Clk_270 are used by the MUX circuitry 110 generate the data signal 114 from the data signals d1, d2, d3, and d4 of the data signals 112, any duty cycle error and/or phase mismatch within the clocks signals negatively affects the generation of the of the data signal 114. For example, duty cycle error and/or phase mismatch within the clock signals Clk_0, CLk_90, Clk_180, and Clk_270 may misalign when a data signal is output by a corresponding latch circuitry 310 and when a corresponding switch 330 selects the output of the latch circuitry 310. In one or more examples, the replica MUX circuitry 120, the detection circuitry 130, the DAC circuitry 140, and the control circuitry 150 detect and mitigate duty cycle errors and/or phase mismatch within the clock and/or data signals to reduce the negative effects caused by the duty cycle errors and/or phase mismatch. For example, phase mismatch between clock signals may be reduced. Additionally, or alternatively, the duty cycles errors may be reduced.

With further reference to FIG. 1, the replica MUX circuitry 120 receives the clock signals 116 and generates the data signal 122. The data signal 122 is indicative of the phasing error between sets of in-phase clock signals (e.g., Clk_0 and Clk_180) and the phase clock signals (e.g., Clk_90 and Clk_270). In one or more examples, the replica MUX circuitry 120 further receives a control pattern from the pattern circuitry 160. The control pattern has a value of "1010" or "0101". As will be described in more detail in the following, based on a data signal 122 generated from the control pattern 1010 and a data signal 122 generated from the control pattern 0101 internal mismatch of the replica MUX circuitry 120 may be detected and mitigated. In other examples, other control pattern values may be used. For example, a control pattern having a value of 1100 may be used to detect duty cycle error in clock signals Clk_0 and Clk_180 and a control pattern having a value of 0110 may be used to detect duty cycle error in clock signals Clk_90 and Clk_270. Further, control patterns having values of 1010 and 0101 may be used to calibrate the data delay to the system data rate.

The replica MUX circuitry 120 is fabricated as a substantial replica of the MUX circuitry 110. The replica MUX circuitry 120 includes the same circuitry layout patterns on a common substrate as the MUX circuitry 110. In one example, the replica MUX circuitry 120 replicates the specific functions and timings (e.g., clock delays, signal delays, rise times, and fall times, among others) of the MUX circuitry 110. The replica MUX circuitry 120 replicates (or substantial emulate) the timing parameters of the MUX circuitry 110 over process, voltage, and temperature. In one example, the replica MUX circuitry 120 is a 4 to 1 MUX configured similar to that of the MUX circuitry 110 as illustrated in FIG. 3.

The detection circuitry 130 generates an error signal 136 based on the data signal 122. In one example, the detection circuitry 130 generates the error signal 136 based on the offset voltage 142. The error signal 136 corresponds to a deviation from an expected phase shift between the in-phase clock signals Clk_0 and Clk_180 and the quadrature clock signals Clk_90 and Clk_270. Further, the error signal 136 corresponds to mismatch within the replica MUX circuitry 120 or mismatch between the replica MUX circuitry 120 and the MUX circuitry 110. In one example, the detection circuitry 130 includes adjustor circuitry 132 that generates the error signal 136 based on the deviation from an expected phase shift between the in-phase clock signals Clk_0 and Clk_180 and the quadrature clock signals Clk_90 and Clk_270.

In one or more examples, for clock signal calibration, an ideal output pulse width is 2 unit interval when the control pattern has a value of 0011 or 0110. For example, a 2 unit interval may be about 35.7 ps (2/56e9). In other examples, the 2 unit interval may be greater than or less than 35.7 ps. For data delay calibration to achieve the correct data relationship, the ideal pulse width is about 17.8 ps (1/56e9). The relationship between clock signals Clk_0 and Clk_90 is the in-band (I) and quadrature (Q) (IQ) delay.

In one example, the data signal 122 is a differential signal and a DC average of each differential signal is determined via low pass filtering. The DC averages are output to the comparator circuitry 134. If the output duty cycle is the ideal duty cycle, the DC averages of the differential duty cycles are the same. In an example where the DC averages of the output signals 122 differ from each other, the clock signals are calibrated as described with regard to FIG. 3.

The detection circuitry 130 further includes a comparator circuitry 134 that generates the error signal 136 based on the offset voltage 142 and the data signal 122. In such examples, the error signal 136 corresponds to mismatch within the replica MUX circuitry 120 or mismatch between the replica MUX circuitry 120 and the MUX circuitry 110.

Figure 2:
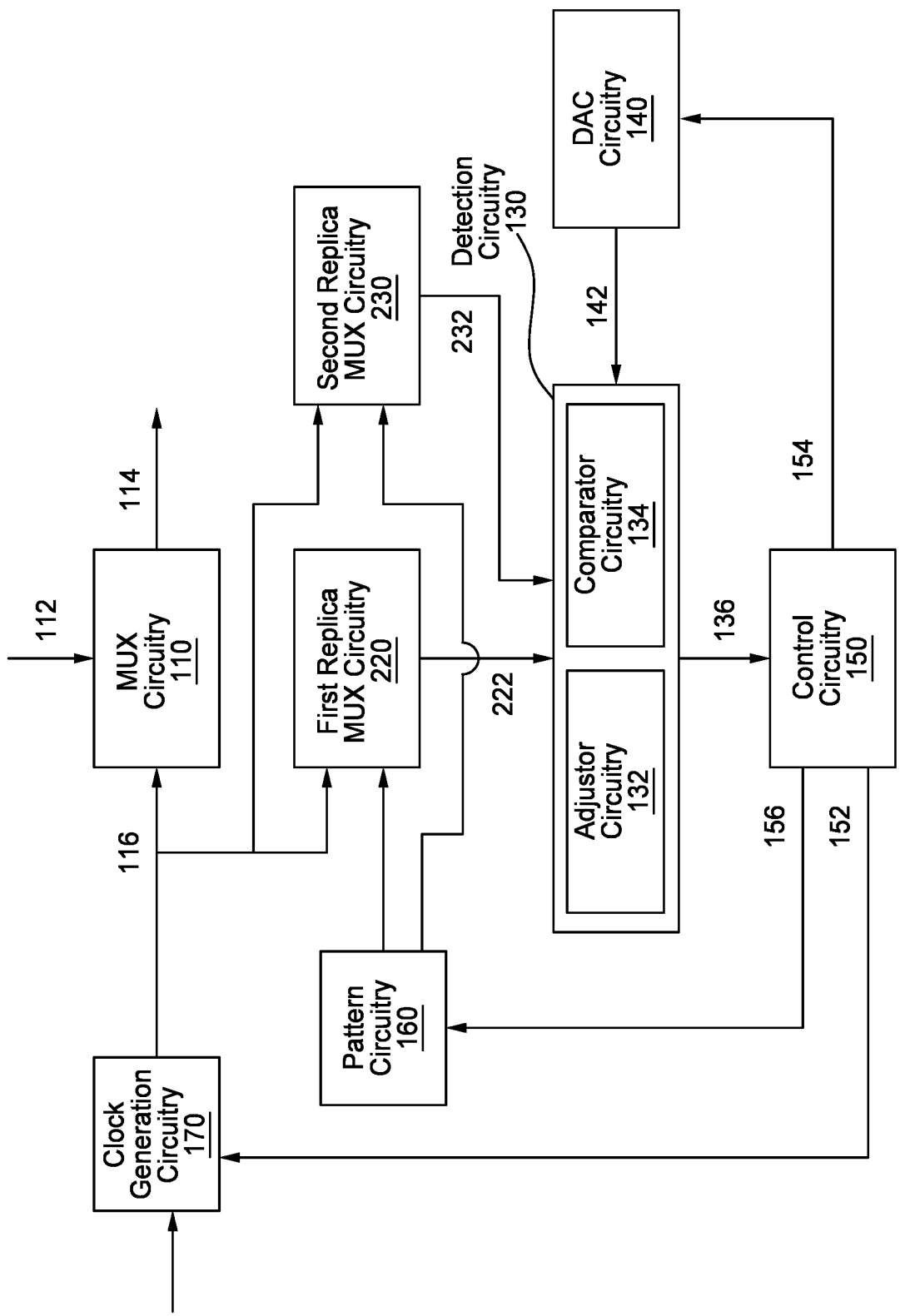
FIG. 2 is a schematic diagram of multiplexer calibration system, according to an example.

In an example, based on FIG. 2, the data signals 222 and 232 are differential signals. Accordingly, when the DC average of the differential signals 232 are not equal, the clock generation circuitry 170 is controlled to delay one or more clock signals. Accordingly, by delaying one or more of the clock signals, the DC average of the signal 232 are adjusted. With reference to FIG. 2, adjusting the delay of the clock signals to adjust the DC average of the data signals 232 calibrates for IQ delay to mitigate duty cycle errors. The replica MUX 230 is used to calibrate for IQ delay and mitigate duty cycle errors. After the completion of IQ delay calibration, the replica MUX circuitry 220 is used to maintain the calibration of the clock calibration circuitry 170 based on the offset voltage 142.

The control circuitry 150 adjusts the timing of the clock generation circuitry 170 based on the error signal 136. For example, the control circuitry 150 provides a control signal 152 to the clock generation circuitry 170 to adjust the timing of one of one or more clock signals based on the error signal 136. Adjusting the timing of the one or more clock signals reduces duty cycle errors and/or phase mismatch within the clock signal 116. The clock generation circuitry 170 generates corrected clock signals 116 based on the control signal 152.

In one example, the control circuitry 150 adjusts the offset voltage 142 generated by the DAC circuitry 140 based on the error signal 136. For example, the control circuitry 150 provides the control signal 154 to the DAC circuitry 140 to instruct the DAC circuitry 140 to increase or decrease the offset voltage 142 by changing corresponding control bits. The control circuitry 150 further provides the control signal 156 to the pattern circuitry 160 to instruct the pattern circuitry 160 to output a respective control pattern (e.g., "1010" or "0101") to the replica MUX circuitry 120.

The MUX calibration system 100 uses an iterative process to detect duty cycle and/or phase mismatches within the clock signal 116 and mismatches associated with the replica MUX circuitry 120. The control circuitry 150 may continuously send control signals 152 to the clock generation circuitry 170 until the error signal 136 is determined to have converged indicating that the errors within the clock signals are within acceptable levels. The error signal 136 is determined to have converged based a determination that the phase difference between two or more of the clock signals is less than or equal to a threshold amount. The control circuitry 150 continuously sends control signals 154 to the DAC circuitry 140 until the error signal 136 is determined to have converged indicating that the mismatch associated with the replica MUX circuitry 120 has been mitigated. In one example, the calibration converges when a differential DC voltage difference of the differential signals 122, 222, or 232 is zero. In one specific example, the clock generation circuitry 170 is controlled such that the data signal 114 has a 17 ps pulse width at 56 Gbps based on a control pattern of 1010.

FIG. 2 is a schematic block diagram of a MUX calibration system 200, according to one or more examples. The MUX calibration system 200 is configured similar to that of the MUX calibration system 100. For example, the MUX calibration system 200 includes the MUX circuitry 110, the detection circuitry 130, the DAC circuitry 140, the control circuitry 150, the pattern circuitry 160, and the clock generation circuitry 170, which are each described in greater detail with regard to FIG. 1. In contrast to the MUX calibration system 100, the MUX calibration system 200 includes a first replica MUX circuitry 220 and a second replica MUX circuitry 230. The first replica MUX circuitry 220 and the second replica MUX circuitry 230 receive the clock signal 116 and output respective data signals 222 and 232 to the detection circuitry 130. Further, the first replica MUX circuitry 220 and the second replica MUX circuitry 230 receive the control pattern output by the pattern circuitry 160.

The first replica MUX circuitry 220 and the second replica MUX circuitry 230 are configured similar to that of the replica MUX circuitry 120. For example, the first replica MUX circuitry 220 and the second replica MUX circuitry 230 have similar timings and operating parameters as the MUX circuitry 110. In one example, the circuit size of the second replica MUX circuitry 230 is greater than that of the first replica MUX circuitry 220. Further, the circuit size of the second replica MUX circuitry 230 is greater than that of the MUX circuitry 110. In one example, the circuit size of the replica MUX circuitry 230 is 3× and the circuit size of the replica MUX circuitry 220 is 1×. In another example, the circuit size of the replica MUX circuitry 230 is the same as the circuit size of the MUX circuitry 110 and the circuit size of the replica mux circuitry 220 is smaller than the circuit size of the MUX circuitry 110. Increasing the circuit size of the second replica MUX circuitry 230 decreases mismatch (e.g., circuitry mismatch) within the second replica MUX circuitry 230. Accordingly, the mismatch of the second replica MUX circuitry 230 is smaller than that of the first replica MUX circuitry 220. Further, the mismatch of the second replica MUX circuitry 230 may be smaller than that of the MUX circuitry 110.

The first replica MUX circuitry 220 and the MUX circuitry 110 have the same circuit size. Accordingly, calibrating for mismatch between the first replica MUX circuitry 220 and the second replica MUX circuitry 230 calibrates for the mismatch between the MUX circuitry 110 and the second replica MUX circuitry 230.

In one example, the second replica MUX is used to calibrate the clock signal 116. For example, the data signal 232 generated by the second replica MUX is processed by the detection circuitry 130 to generate the error signal 136. The error signal 136 is received by the control circuitry 150 to generate the control signal 152 which is provided to the clock generation circuitry 170. The clock generation circuitry 170 generates corrected clock signals 116 based on the control signal 152. Further, the control patterns generated by the pattern circuitry 160 are used by the second replica MUX circuitry 230 to calibrate for mismatch within the second replica MUX circuitry 230. For example, a first data signal (e.g., the data signal 232) is generated based on the control pattern 0101. The clock signals 116 are adjusted while the control pattern is 0101. A second data signal (e.g., the data signal 232) is generated by the second replica MUX circuitry 230 based on the control pattern 1010. The second data signal 232 is adjusted based on the offset voltage 142 until the differential pair associated with the second data signal 232 is determined to converge. The offset voltage 142 is adjusted by adjusting the control bits of the DAC circuitry 140 until output of the comparator circuitry 134 converges (e.g., is less than or equal to a threshold value). For example, the control circuitry 150 generates the control signal 154 providing an indication to the DAC circuitry 140 to adjust the control bits to adjust the offset voltage 142. Once the error signal 136 indicates that the output of the comparator circuitry 134 converges, the control bits are stored. In one example, the control bits are divided by two before being stored.

The data signal 232 is a pair of differential output signals from two differential replica MUX circuitries configured similar to the replica MUX circuitry 230. At the completion of the calibration process, the difference between the two single ended DC average voltages after low pass filter is zero after calibration is done. Further, the data signal 222 is a pair of differential output signals from two differential replica MUX circuitries configured similar to that of the replica MUX circuitry 220. At the completion of the calibration process, the difference between the two single ended DC average voltage signals is zero.

In one example, the second data signal (e.g., the data signal 232) is generated by the second replica MUX circuitry 230 based on the second control pattern 1010, the first control pattern is 0101. When no errors exist within the MUX calibration system 100, the output signals based on the control patterns 0101 and 1010 result in the same effective clock signal 116. In one example, due to one or more errors within the MUX calibration system 100, mismatch will exist in the differential signals of the data signal 232. The clock signal 116 are adjusted based on the DAC circuitry 140 and the offset voltage 142 by storing the 1010/0101 pattern difference into the DAC circuitry 140. The control bits are divided by 2 as the average between the 0101/1010 patterns is determined.

The first replica MUX circuitry 220 generates the data signal 222 based on the corrected clock signals 116 determined based on the data signal 232. Further, the first replica MUX circuitry 220 receives the control pattern 0101 from the pattern circuitry 160. In one example, mismatch between the first replica MUX circuitry 220 and the second replica MUX circuitry 230 is offset by adjusting the offset voltage 142 (and the control bits) until the output of the detection circuitry 130 converges to differential zero. The control circuitry 150 instructs the DAC circuitry 140 to adjust the offset voltage 142 (and the control bits) until the output of the detection circuitry 130 converges. In one example, based on the inputs to the comparator 134 being equal, the error signal 136 toggles between a value of 1 and 0. The control signal 150 receives the error signal 136, and based on the number of 1's equaling the number of 0's, the error signal 136 is determined to have converged. Further, based on a determination that the 1's and 0's output by the error signal 136 being equal, the error signal 136 is indicative of no error. The control circuitry 150 provides the control signal 154 to the DAC circuitry 140, instructing the DAC circuitry 140 to store the control bits and the voltage offset based on the output of the comparator circuitry 134 converging.

In the example of FIG. 3, the second replica MUX circuitry 230 is used during a calibration period and the first replica MUX circuitry 220 is used during an operation period of the MUX circuitry 110 during which the MUX circuitry 110 generates the data signals. The first replica MUX circuitry 220 compensates for process, voltage, or temperature variations that occur during operation of the corresponding transmitter circuitry. The calibration period occurs before the operation period. During the calibration period, the MUX circuitry 110 may or may not output data signals. In one example, based on the clock signals 116 being corrected during the calibration period, the second replica MUX circuitry 230 is disabled and the first replica MUX circuitry 220 is enabled. Disabling the second replica MUX circuitry 230 and enabling the first replica MUX circuitry 220 decreases the amount of power used by the MUX calibration system 200, as the circuit size of the first replica MUX circuitry 220 is smaller than that of the second replica MUX circuitry 230.

Figure 4:
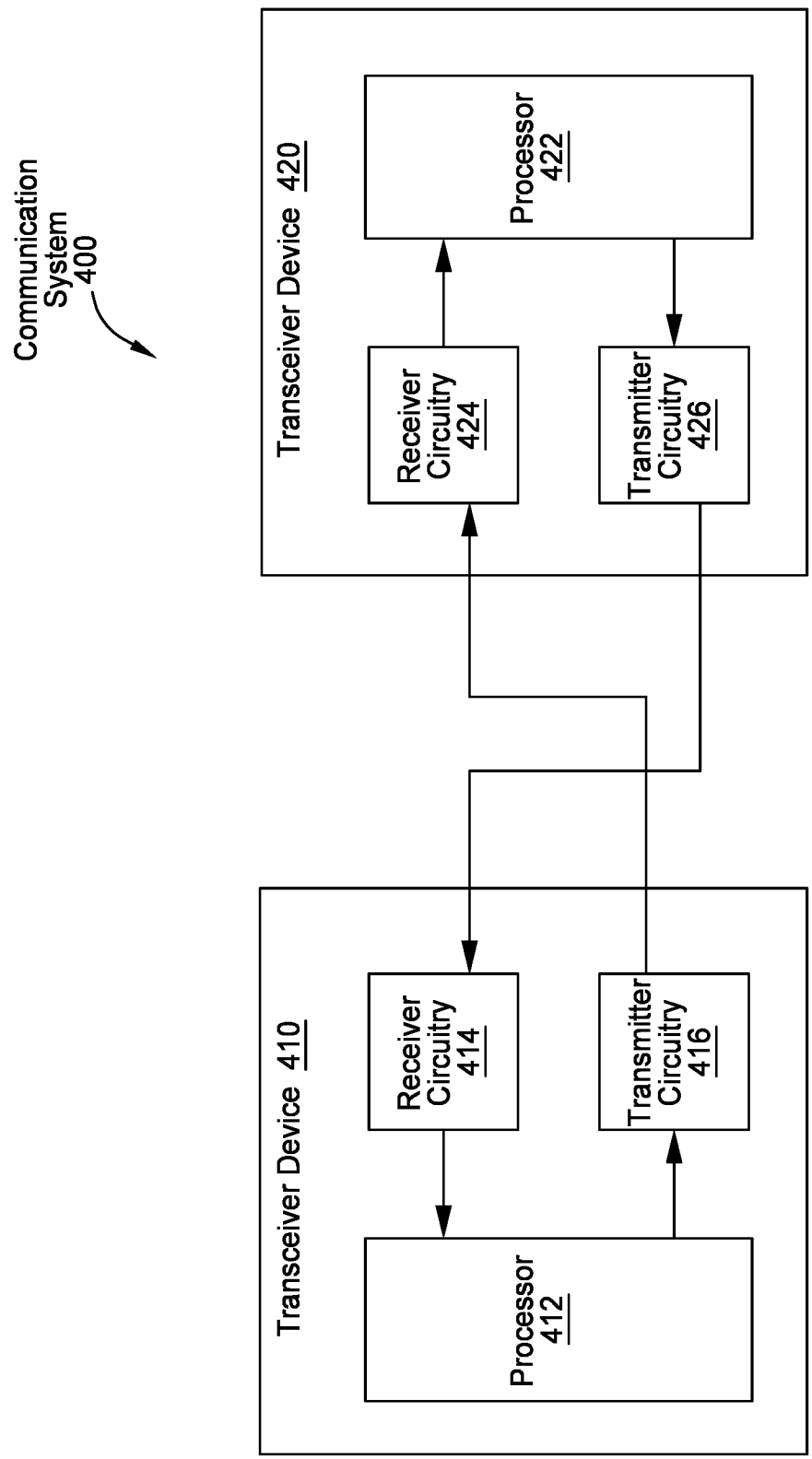
FIG. 4 is a schematic block diagram of a communication system, according to an example.

FIG. 4 illustrates a block diagram of a communication system 400, according to one or more examples. The communication system 400 includes one or more ICs. In one example, the communication system includes transceiver (serializer/deserializer) devices 410 and 420. The transceiver devices 410 and 420 each include one or more ICs. In one example, the transceiver device 410 is a computing device and the device 420 is a routing device that communicate over a high speed connection. The computing device 410 includes transmitter circuitry 416 that communicates data to receiver circuitry 424 of the router device 420. The computing device 410 further includes processor 412 that receives data from the receiver circuitry 414 and provides data to the transmitter circuitry 416. Further, the routing device 420 includes a processor 422 that receives data from the receiver circuitry 424 and provides data to the transmitter circuitry 426. The transmitter circuitry 426 communicates data to the receiver circuitry 414. In one example, the transmitter circuitry 416 or the transmitter circuitry 426 includes a MUX calibration system configured similar to that of the MUX calibration system 100 or the MUX calibration system 200. The transmitter circuitry 416 and transmitter circuitry 426 may be referred to as transmitter front end circuitry.

Figure 5:
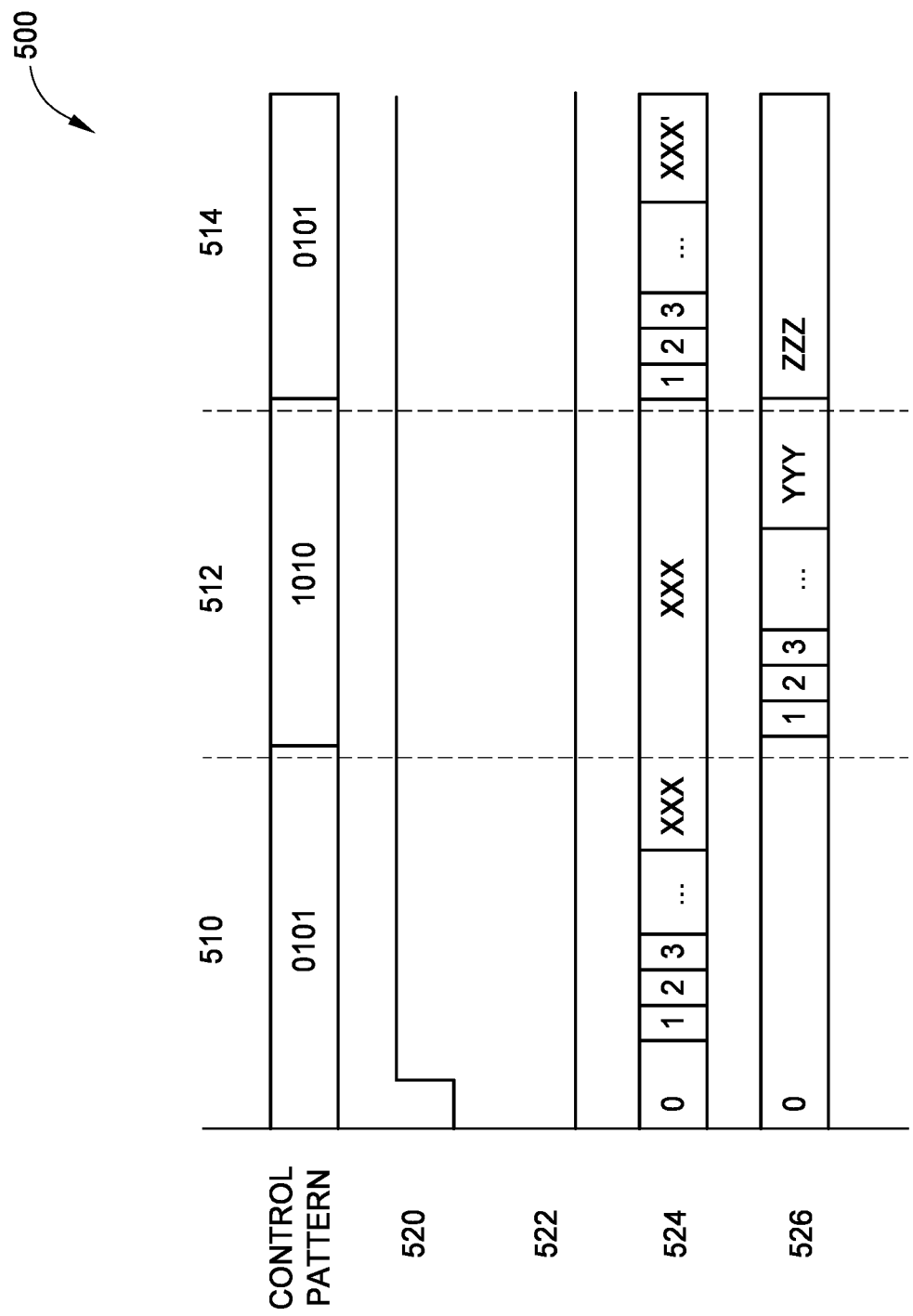
FIG. 5 is a timing diagram for a multiplexer calibration system, according to an example.

FIG. 5 illustrates a timing diagram 500 for a MUX calibration system (e.g., the MUX calibration system 200 of FIG. 2), according to one or more examples. The timing diagram 500 includes periods 510, 512, and 514. The period 512 occurs between the periods 510 and 514. The periods 510-512 are non-overlapping with each other. Further, the periods 510-514 may correspond to a calibration period of the MUX calibration system 200 that occurs before operation of the MUX circuitry 110.

During the period 510, the enable signal 520 transitions to high value, enabling the second replica MUX circuitry 230. Further, during the period 510, the enable signal 522 has a low value, disabling the first replica MUX circuitry 220. Further, the control pattern 0101 is provided to the second replica MUX circuitry 230 by the pattern circuitry 160. The control pattern 0101 identifies the clock pattern of the first replica MUX circuitry 220. In one example, controlling the clock pattern of the replica MUX circuitry (e.g., the replica MUX circuitry 220 or 230 of FIG. 2) allows for the determination as to whether or not the rising edge of the pulse is clocked out by which clock edge. The second replica MUX circuitry 230 receives the clock signals 116 and generates the data signal 232 from the clock signal 116. The detection circuitry 130 processes the data signal 232 to detect duty cycle and/or phase errors within the clock signals 116 and generates the error signal 136. The control circuitry 150 receives the error signal 136 and generates the control signal 152. The control signal 152 is provided to the clock generation circuitry 170 to adjust the clock signals, generating corrected clock signals 116. In one example, the error signal 136 indicates that the phase of one or more of the clock signals Clk_0, Clk_90, Clk_180, and Clk_270 of the clock signals 116 differs from another one or more of the clock signals. In one example, the clock signals 116 are adjusted until the phase difference between the clock signals Clk_0 and Clk_90 is less than or equal to 4 ps. In another example, the clock signals 116 are adjusted until the phase difference between the clock signals Clk_0 and Clk_90 is less than equal to N ps, where N is greater than 4 ps. In one or more examples, the clock generation circuitry 170 adjusts clock control bits based on the control signal 152 to adjust the clock signals 116. Based on the phase difference between two or more of the clock signals 116 being less than or equal to a threshold (e.g., N ps, where N is 4 or more), the current clock control bits are stored. In one example, adjusting the clock control bits 524 adjusts the delay of a rising or falling edge of one or more of the clock signals 116. In one example, a 17 ps pulse for IQ calibration at the data signal 114 is targeted. Accordingly, in view of the example of FIG. 3, the combined delay of the switches 340a and 340b of FIG. 3 is 4 ps. If the clock signals Clk_0 and Clk_90 overlap at the beginning, the clock signal Clk_90 is further delayed by 3.8 ps in order to have the clock pattern 1010 being space out with equal pulse. In one example, the clock signals Clk_0 and Clk_90 are delayed by 4 ps and another 2-4 ps is used to compensate for voltage and/or temperature drift. In one example, if the delay of the switches 320a and 340b is large, the clock signals Clk_0 and Clk_90 are delayed by less than 4 ps. In one example, the threshold of N ps changes based on the corresponding data rate. In one example, the target is to have the clock pattern 1010 transmitted with a 1/(data rate) pulse width.

During the period 512, the control pattern provided by the pattern circuitry 160 to the second replica MUX circuitry 230 is 1010. Accordingly, during the period 512 the control pattern differs from the control pattern of the period 510. Further, during the control pattern the second replica MUX circuitry 230 is enabled by the enable signal 520 and the first replica MUX circuitry 220 is disabled by the enable signal 522. The clock control bits 524 are unchanged during the period 512. During the period 512, the second replica MUX circuitry 230 generates the data signal 232 based on the clock signals generated based on the clock control bits 524 determined during the period 510. The data signal 232 is adjusted based on the offset voltage 142 generated by the DAC circuitry 140. The control circuitry 150 generates the control signal 152 providing an indication to the DAC circuitry 140 to adjust the DAC control bits 526, adjusting the offset voltage 142. The control circuitry 150 generates the control signal 154 providing an indication to the DAC circuitry 140 to stop adjusting and store the DAC control bits 526 based on the error signal 136 indicating that the difference between single ended average voltage of the differential data signal 232 is equal to zero when using the control pattern 1010.

During the period 514, the DAC control bits 526 are divided by two. Further, during the period 514 the control pattern is 0101, the enable signal 520 enables the second replica MUX circuitry 230, and the enable signal 522 disables the first replica MUX circuitry 220. The second replica MUX circuitry 230 generates the data signal 232 based on the clock signals 116 generated from the clock control bits 524 determined during period 510. The data signal 232 is processed based on the offset voltage 142 generated by the DAC circuitry 140 based on the stored DAC control bits to detect phase or duty cycle differences within the clock signals 116. The control circuitry 150 generates the control signal 152 based on the error signal 136 generated by the detection circuitry 130. The control circuitry 150 generates a control signal 152 providing an indication to the clock generation circuitry 170 to adjust the clock control bits 524 and one or more of the clock signals 116 until the difference of the average DC voltage of the single ended output of the differential pair 232 is zero.

During the periods 510, 512, and 514, phase and/or duty cycle errors within the clock signals are minimized. Further, during the periods 510, 512, and 514 mismatch within the second replica MUX circuitry 230 is minimized.

Figure 6:
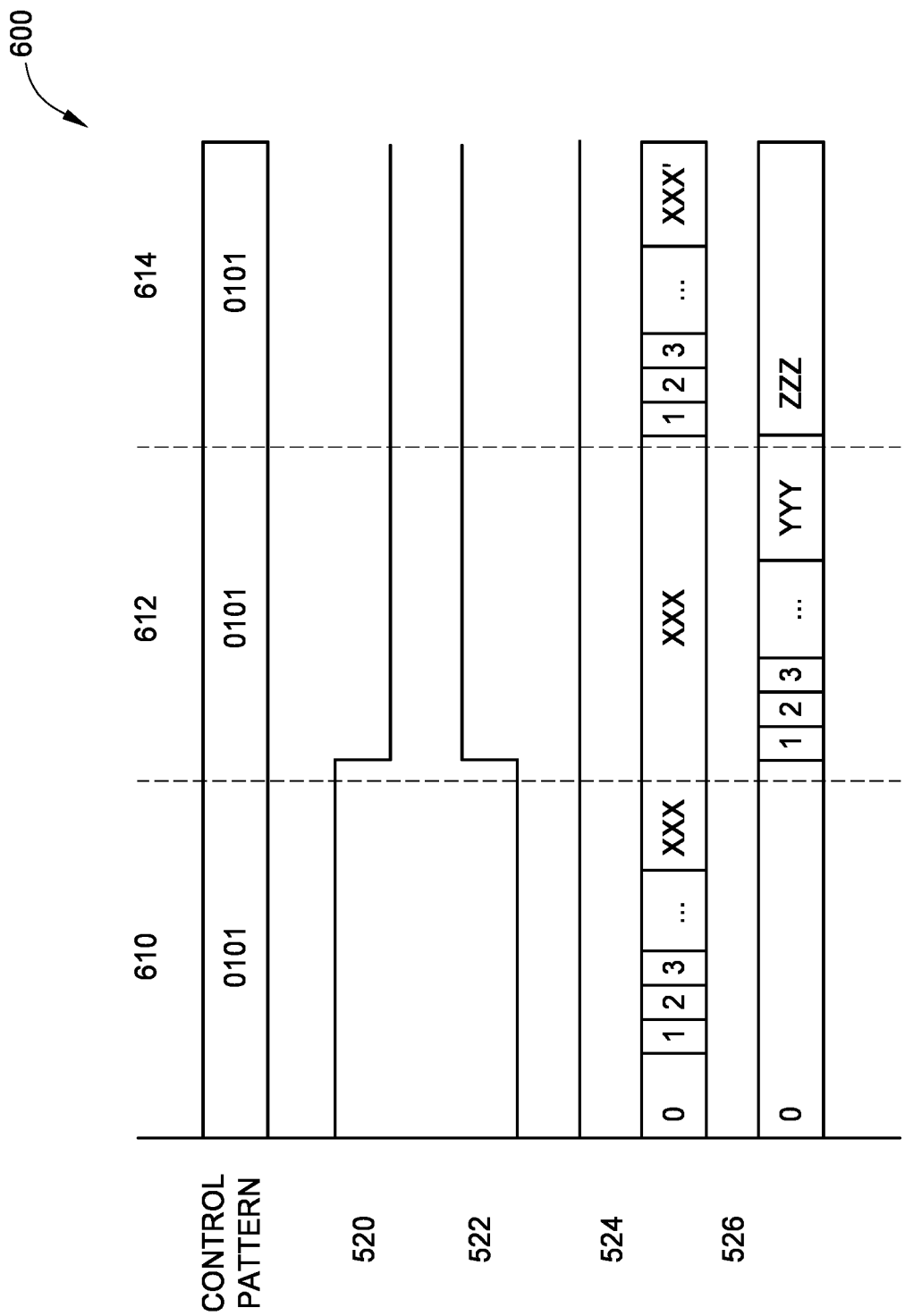
FIG. 6 is a timing diagram for a multiplexer calibration system, according to an example.

FIG. 6 illustrates the timing diagram 600 that may applied to the MUX calibration system 200. The timing diagram 600 includes periods 610, 612, and 614. The periods 610, 612, and 614 occur sequentially and are non-overlapping with each other. During period 610, the control pattern provided by the pattern circuitry 160 is 0101. The second replica MUX circuitry 230 is enabled by the enable signal 520 and the first replica MUX circuitry 220 is disabled by the enable signal 522. Further, as is described with regard to the timing diagram 500, the second replica MUX circuitry 230, the detection circuitry 130, the control circuitry 150, and the clock generation circuitry 170 adjusts the clock signals 116 The clock control bits 524 are stored at the end of the period 610.

During the period 612, the first replica MUX circuitry 220 is enabled based on the enable signal 522 transitioning to a high voltage level, and the second replica MUX circuitry 230 is disabled based on the enable signal 520 transitioning to a low voltage level. Further, during the period 612, the control pattern provided by the pattern circuitry 160 to the first replica MUX circuitry 220 is 0101. Accordingly, during the period 612 the control pattern is the same as that of the period 610. The clock control bits 524 are unchanged during the period 612. During the period 612, the first replica MUX circuitry 220 generates a data signal 222 based on the clock signals generated based on the clock control bits 524. The data signal 222 is adjusted based on the offset voltage 142 generated by the DAC circuitry 140. The control circuitry 150 generates the control signal 152 providing an indication to the DAC circuitry 140 to adjust the DAC control bits 526, adjusting the offset voltage 142. The control circuitry 150 generates the control signal 152 providing an indication to the DAC circuitry 140 to stop adjusting and store the DAC control bits 526 based on the error signal 136 indicating that data signal 222 is differential zero.

During the period 614, the DAC control bits 526 are divided by two. Further, during the period 614 the control pattern is 0101, the enable signal 520 disables the second replica MUX circuitry 230, and the enable signal 522 enables the first replica MUX circuitry 220. The first replica MUX circuitry 220 generates the data signal 222 based on the clock signals 116 generated from the clock control bits 524 determined during period 610. The data signal 222 is processed based on the offset voltage 142 generated by the DAC circuitry 140 based on the stored DAC control bits 526 to detect phase or duty cycle differences within the clock signals 116. The control circuitry 150 generates the control signal 152 based on the error signal 136 generated by the detection circuitry 130. The control circuitry 150 generates a control signal 152 providing an indication to the clock generation circuitry 170 to adjust the clock control bits 524 and one or more of the clock signals 116 until the phase difference between two or more of the clock signals 116 (e.g., clock signals in quadrature with each other) being less than or equal to a threshold (e.g., about 4 ps or greater). The updated clock control bits 524 are stored by the clock generation circuitry 170.

Figure 7:
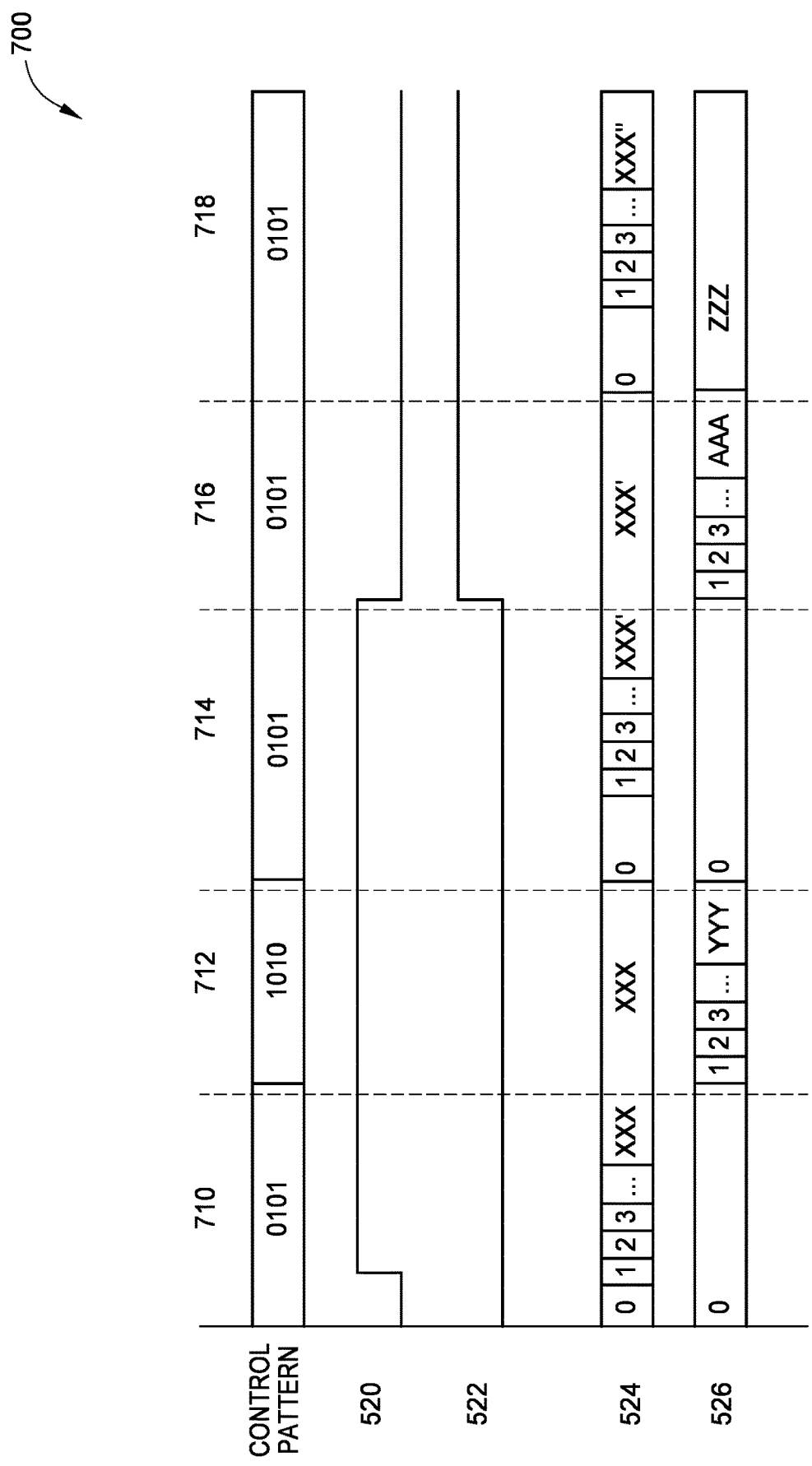
FIG. 7 is a timing diagram for a multiplexer calibration system, according to an example.

FIG. 7 illustrates the timing diagram 700 that may applied to the MUX calibration system 200. The timing diagram 700 includes the periods 710, 712, 714, 716, and 718. In one example, the periods 710, 712, 714, 716, and 718 occur sequentially. Further, the periods 710, 712, 714, 716, and 718 are non-overlapping. Further, during the periods 716 and 718 the clock control bits 524 determined during the period 714 and the DAC control bits 526 determined during the period 712 are used to determine the clock control bits 524 and the DAC control bits 526 of the periods 716 and 718.

Figure 8:
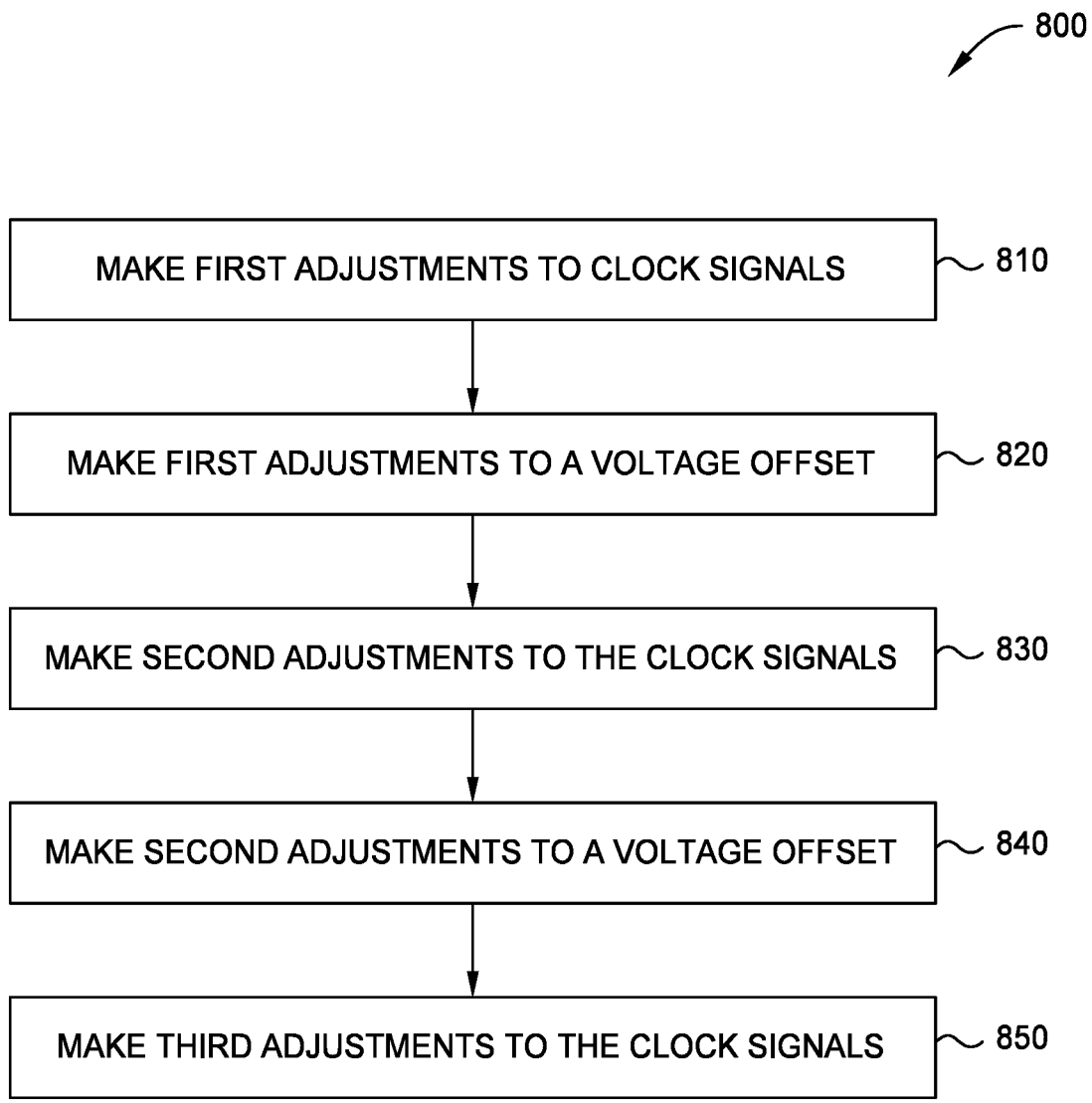
FIG. 8 is a flow chart of a method for calibrating a multiplexer, according to an example.

FIG. 8 illustrates a flow chart of a method 800 for a MUX, according to one or more examples. At block 810, first adjustments are made to a clock control signals. In one example, the clock signals 116 of FIG. 2 are adjusted as described with regard to the period 510 of FIG. 5. For example, as is described with regard to the period 510 of FIG. 5, the second replica MUX circuitry 230 generates the data signal 232 based on the clock signals 116. The detection circuitry 130 generates the error signal 136 from the data signal 232. The control circuitry 150 generates the control signal 152 based the error signal 136. The clock generation circuitry 170 adjusts one or more of the clock signals 116 based on control signal 152. The clock signals 116 are adjusted until the phase difference between two or more of the clock signals 116 (e.g., clock signals Clk_0 and Clk_90) is less than or equal to a threshold (e.g., about 4 ps or greater).

At block 820, a voltage offset is adjusted. In one example, the offset voltage 142 of FIG. 2 is adjusted as described with regard to the period 512 of FIG. 5. For example, as is described with regard to the period 512 of the FIG. 5, the second replica MUX circuitry 230 outputs the data signal 232 which is adjusted based on the offset voltage 142. The data signal 232 is a pair of differential output signals from two replica MUX circuitries 230 configured as differential MUX circuitries. The data signal 232 is adjusted based on the offset voltage 142. The control circuitry 150 instructs the DAC circuitry 140 to adjust the offset voltage 142 via a control signal 152. The offset voltage 142 is adjusted until the output of the detection circuitry 130 determines that the DC average output of the differential pair of the data signal 232 is equal (e.g., converge).

At block 830, second adjustments are made to the clock signals. In one example, the clock signals 116 of FIG. 2 are adjusted as described with regard to the period 514 of FIG. 5. For example, as is described with regard to the period 514 of FIG. 5, the second replica MUX circuitry 230 generates the data signal 232 based on the clock signals 116 and the offset voltage 142 determined during the block 520. The clock signals 116 are adjusted until the phase difference between two or more of the clock signals 116 (e.g., clock signals Clk_0 and Clk_90) is less than or equal to a threshold (e.g., about 4 ps or greater).

At block 840, second adjustments are made to the voltage offset. In one example, the offset voltage 142 of FIG. 2 is adjusted as is described with regard to the period 612 of FIG. 6. For example, as is described with regard to the period 612 of the FIG. 6, the first replica MUX circuitry 220 outputs the data signal 222. The data signal 222 is a differential data signal provided by two replica MUX circuitries 220 configured as differential MUX circuitries. The data signal 222 is adjusted based on the offset voltage 142. The control circuitry 150 instructs the DAC circuitry 140 to adjust the offset voltage 142 via a control signal 152. The offset voltage 142 is adjusted until the output of the detection circuitry 130 determines that the DC average output of the differential pair of the data signal 222 is equal (e.g., converge).

At block 850, third adjustments are made to the clock signals. In one example, the clock signals 116 of FIG. 2 are adjusted as described with regard to the period 614 of FIG. 6. For example, as is described with regard to the period 614 of FIG. 6, the first replica MUX circuitry 220 generates the data signal 222 based on the clock signals 116 determined at the blocks 830 and 840, respectively. The clock signals 116 are adjusted until the phase difference between two or more of the clock signals 116 116 (e.g., clock signals Clk_0 and Clk_90) is less than or equal to a threshold (e.g., about 4 ps or greater).

In the above, a communication device including transmitter circuitry having an improved MUX calibration system is described. The MUX calibration system includes a replica MUX that is used to calibrate the clock signals to mitigate errors within the clock signals. A digital-to-analog converter (DAC) circuitry may be used to compensate for mismatch (e.g., circuitry element mismatch) between the replica MUX and the main MUX of the transmitter circuitry. Compensating for mismatch improves the clock calibration process, further mitigating errors within the clock signals. In one or more examples, the MUX calibration system includes replica MUXs of different circuit sizes that are used at different times to calibrate the clock signals to decrease the amount of power used by the corresponding transmitter circuitry.

While the foregoing is directed to specific examples, other and further examples may be devised without departing from the basic scope thereof, and the scope thereof is determined by the claims that follow.

What is claimed is:

1. A multiplexer (MUX) calibration system comprising:
main MUX circuitry configured to receive clock signals and output a first data signal based on the clock signals;
first replica MUX circuitry configured to receive the clock signals and output a differential data signal based on the clock signals;
digital-to-analog (DAC) circuitry configured generate an offset voltage;
detection circuitry configured to receive the differential data signal and the offset voltage and generate a first error signal based on one or more of the differential data signal and the offset voltage; and
control circuitry configured to:
receive the first error signal; and
generate a first control signal indicating an adjustment to the clock signals and a second control signal indicating an adjustment to the offset voltage based on a detected difference in the differential data signal.

2. The MUX calibration system of claim 1 further comprises clock generation circuitry configured to generate the clock signals, wherein the main MUX circuitry and the first replica MUX circuitry are coupled to the clock generation circuitry to receive the clock signals.

3. The MUX calibration system of claim 1, wherein determining the first error signal comprises determining one or more of a duty cycle error or a phase difference between two of the clock signals based on the first data signal.

4. The MUX calibration system of claim 1, wherein determining the first error signal comprises detecting mismatch between the first replica MUX circuitry and the main MUX circuitry based on the differential data signal and the offset voltage.

5. The MUX calibration system of claim 1 further comprising second replica MUX circuitry configured to receive first clock signals and output a third data signal.

6. The MUX calibration system of claim 5, wherein the first replica MUX circuitry is configured to output the differential data signal during a first period, and the second replica MUX circuitry is configured to output the third data signal during a second period non-overlapping with the first period.

7. The MUX calibration system of claim 6, wherein the detection circuitry is configured to generate a second error signal based on the third data signal, and wherein the control circuitry is further configured to receive the second error signal and generate a third control signal indicating an adjustment to the offset voltage based on the second error signal.

8. The MUX calibration system of claim 5, wherein a circuit size of the first replica MUX circuitry is larger than a circuit size of the second replica MUX circuitry.

9. The MUX calibration system of claim 1 further comprising pattern circuitry configured to output a first control pattern and a second control pattern to the first replica MUX circuitry to detect mismatch within the first replica MUX circuitry.

10. A transmitter circuitry comprising:
a multiplexer (MUX) calibration system comprising:
main MUX circuitry configured to receive clock signals and output a first data signal based on clock signals;
first replica MUX circuitry configured to receive the clock signals and output a differential data signal based on the clock signals; and
digital-to-analog (DAC) circuitry configured generate an offset voltage, wherein the MUX calibration system is configured to generate a first control signal based on a first error signal determined based on the differential data signal and the offset voltage and a second control signal indicating an adjustment to the offset voltage based on a detected difference in the differential data signal; and
clock generation circuitry coupled to the main MUX circuitry and the first replica MUX circuitry, and configured to adjust the clock signals based on the first control signal.

11. The transmitter circuitry of claim 10, wherein the MUX calibration system is further configured detect one or more of a duty cycle error or a phase difference between two of the clock signals based on the differential data signal.

12. The transmitter circuitry of claim 10, wherein MUX calibration system is further configured to detect mismatch between the first replica MUX circuitry and the main MUX circuitry based on a comparison of the differential data signal and the offset voltage.

13. The transmitter circuitry of claim 10, wherein the MUX calibration system further comprises a second replica MUX circuitry configured to receive the clock signals and output a third data signal.

14. The transmitter circuitry of claim 13, wherein the first replica MUX circuitry is configured to output the differential data signal during a first period, and the second replica MUX circuitry is configured to output the third data signal during a second period non-overlapping with the first period.

15. The transmitter circuitry of claim 13, wherein the MUX calibration system is further configured to adjust the offset voltage based on the second control signal.

16. The transmitter circuitry of claim 13, wherein a circuit size of the first replica MUX circuitry is larger than a circuit size of the second replica MUX circuitry.

17. The transmitter circuitry of claim 10, wherein the MUX calibration system further comprises pattern circuitry configured to output a first control pattern and a second control pattern to the first replica MUX circuitry to detect mismatch within the first replica MUX circuitry.

18. A method for calibrating a multiplexer, the method comprising:
generating, via a first replica multiplexer (MUX) circuitry of a MUX calibration system, a differential data signal based on clock signals;
outputting, via a digital-to-analog converter (DAC) of the MUX calibration system, a first offset voltage;
generating a first error signal based on the differential data signal and the first offset voltage;
generating a first control signal based on the first error signal;
generating a second control signal based on a detected difference in the differential data signal, the second control signal indicating an adjustment to the first offset voltage; and
adjusting the clock signals based on the first control signal.

19. The method of claim 18 further comprising:
outputting, via second replica MUX circuitry, a second data signal based on the clock signals;
generating a second error signal based on the second data signal and the first offset voltage;
generating a third control signal based on the second error signal; and
adjusting the first offset voltage based on the third control signal.

20. The method of claim 19 further comprising outputting a first control pattern and a second control pattern to the first replica MUX circuitry to detect mismatch within the first replica MUX circuitry.

* * * * *